United States Patent [19]

Honnigford et al.

[11] Patent Number: 5,365,200

[45] Date of Patent: Nov. 15, 1994

[54] CMOS GAUGE DRIVER

[75] Inventors: Edward H. Honnigford, Russiaville; Gregory J. Manlove, Kokomo, both of Ind.

[73] Assignee: Delco Electronics Corporation, Kokomo, Ind.

[21] Appl. No.: 957,837

[22] Filed: Oct. 8, 1992

[51] Int. Cl.⁵ .......................... H03F 1/34; G01R 1/30
[52] U.S. Cl. ................... 330/293; 324/123 C; 324/144; 330/294; 330/307
[58] Field of Search ............... 324/123 R, 123 C, 124, 324/143, 144; 330/260, 293, 294, 307

[56] References Cited

U.S. PATENT DOCUMENTS

| | | | |
|---|---|---|---|
| 3,624,625 | 11/1971 | Stonestreet | 340/177 |
| 4,841,238 | 6/1989 | Birch | 324/144 |
| 4,875,041 | 10/1989 | Dannenberg | 340/870 |
| 4,914,384 | 4/1990 | Taylor et al. | 324/125 |
| 4,935,683 | 6/1990 | Kobler et al. | 318/603 |
| 4,991,098 | 2/1991 | Dantzler | 364/424 |
| 5,059,916 | 10/1991 | Johnson | 324/143 X |

Primary Examiner—James B. Mullins
Attorney, Agent, or Firm—Anthony L. Simon; Jimmy L. Funke

[57] ABSTRACT

An integrated circuit apparatus comprises a first stage amplifier and a second stage amplifier. The first stage amplifier is characterized by a cross-coupled integrated layout providing a rail-to-rail swing and a linear gain, A, substantially defined as $A = g_m r_o'$. The second stage amplifier is coupled to the output of the first stage amplifier and comprises a high-voltage integrated circuit transistor with an AC feedback circuit, the AC feedback circuit comprising, in series, a capacitor, a N+ resistor and an N-WELL resistor, wherein the output of the second stage amplifier is used to directly drive an inductive load.

8 Claims, 2 Drawing Sheets

CMOS GAUGE DRIVER

This invention relates to a driver circuit for an air core gauge using CMOS technology.

BACKGROUND OF THE INVENTION

Typically, gauge drivers that are controlled by integrated circuits use external transistors to drive the gauge with the base or the gate of the transistor being controlled by the integrated circuit. External transistors are used because they are less sensitive than integrated circuits to high voltages across the air core gauge caused by transient supply voltages. Typical high density integrated circuits sustain damage or disruption of operation when such voltages, which are often on the order of 40 volts, are received. Additionally, the typical gauge drive system using external transistors is a three-stage driver that requires additional external components to maintain proper feedback. What is desired is an integrated circuit gauge drive system minimizing the need for external components.

SUMMARY OF THE INVENTION

The apparatus of this invention provides an integrated circuit gauge driver capable of driving an air core gauge or other inductive load without external transistors.

Advantageously, the apparatus of this invention is capable of handling high voltages caused by transients in the gauge supply voltage. Advantageously, the apparatus of this invention includes a two-stage amplifier having simplified feedback compensation. Advantageously, the apparatus of the invention reduces the number of external components necessary to drive a low impedance load (i.e., a load with an impedance less than 1000 ohms, typically on the order of 100 ohms).

Structurally, the apparatus of this invention comprises an integrated circuit with a first stage amplifier and a second stage amplifier. The first stage amplifier is characterized by a cross-coupled integrated layout providing a linear gain, A, substantially defined as $A = g_m r_o'$. The second stage amplifier is coupled to the output of the first stage amplifier and comprises a high-voltage integrated circuit transistor with an AC feedback circuit, the AC feedback circuit comprising, in series, a capacitor, a N+ resistor and an N-WELL resistor, wherein the output of the second stage amplifier is used directly drive an inductive load.

A more detailed description of this invention and its implementation is set forth below.

DETAILED DESCRIPTION OF THE INVENTION

Figure 1:
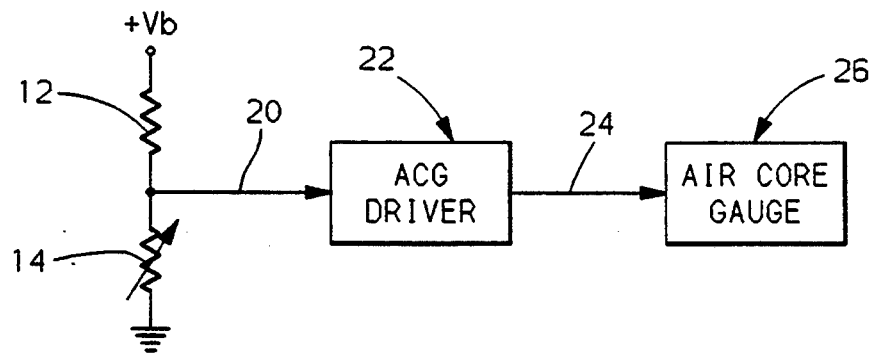
FIG. 1 is an illustration of this invention in an air core gauge system.

Referring to FIG. 1, the apparatus of this invention is shown schematically in an air core gauge system. Air core gauges are used in vehicle instrumentation clusters to indicate to vehicle operators measurements of vehicle parameters, such as fuel level, engine temperature, etc.

Typically, the parameter being measured is sensed by a sender 14 having an impedance that varies in relation to the parameter being measured. Sender 14 is connected in a voltage divider circuit with resistor 12 coupled between the vehicle supply voltage $+V_b$ and the vehicle ground so that the voltage at line 20 is a signal that varies with the impedance of sender 14 and, therefore, varies in relation to the measure of the parameter.

The signal on line 20 may be directly coupled to circuit 22, or may first be connected to a signal processing circuit (not shown), which may be any known or suitable form of sender signal processing circuitry to provide such functions as curve fitting, hysteresis, etc., to the sender signal in manners well known to those skilled in the art. An example of suitable signal processing circuitry is set forth in pending U.S. patent application Ser. No. 07/944,158, filed Sep. 11, 1992, assigned to the assignee of this invention, and the disclosure of which is incorporated herein by reference. Many types of circuits are useful as signal processing circuits, including analog, digital and/or microcomputer implementations. The processing circuitry, if implemented, would provide a processed signal to the input of air core gauge driver 22. Since signal processing circuitry is not necessary to practice this invention, no further detail thereof is set forth herein.

The signal on line 20 is the input signal for the air core gauge driver 22 of this invention. The input signal acts as a command for control of the position of air core gauge 26 and air core gauge driver 22 provides a drive signal on line 24 responsive to the command on line 20 to control the air core gauge 26.

Air core gauge 26 may be any suitable type of air core gauge. In general, air core gauges comprise at least one coil wound around a magnetic rotor that is rotatably mounted within the coil. As current is applied to the coil, a magnetic field is created having a direction to which the magnetic rotor rotates to align itself. Attached to the magnetic rotor is a spindle with a pointer mounted on the end, so that as the magnetic rotor rotates, the spindle and pointer rotate, wherein the position of the pointer indicates a measurement to an observer of the gauge.

Figure 2:
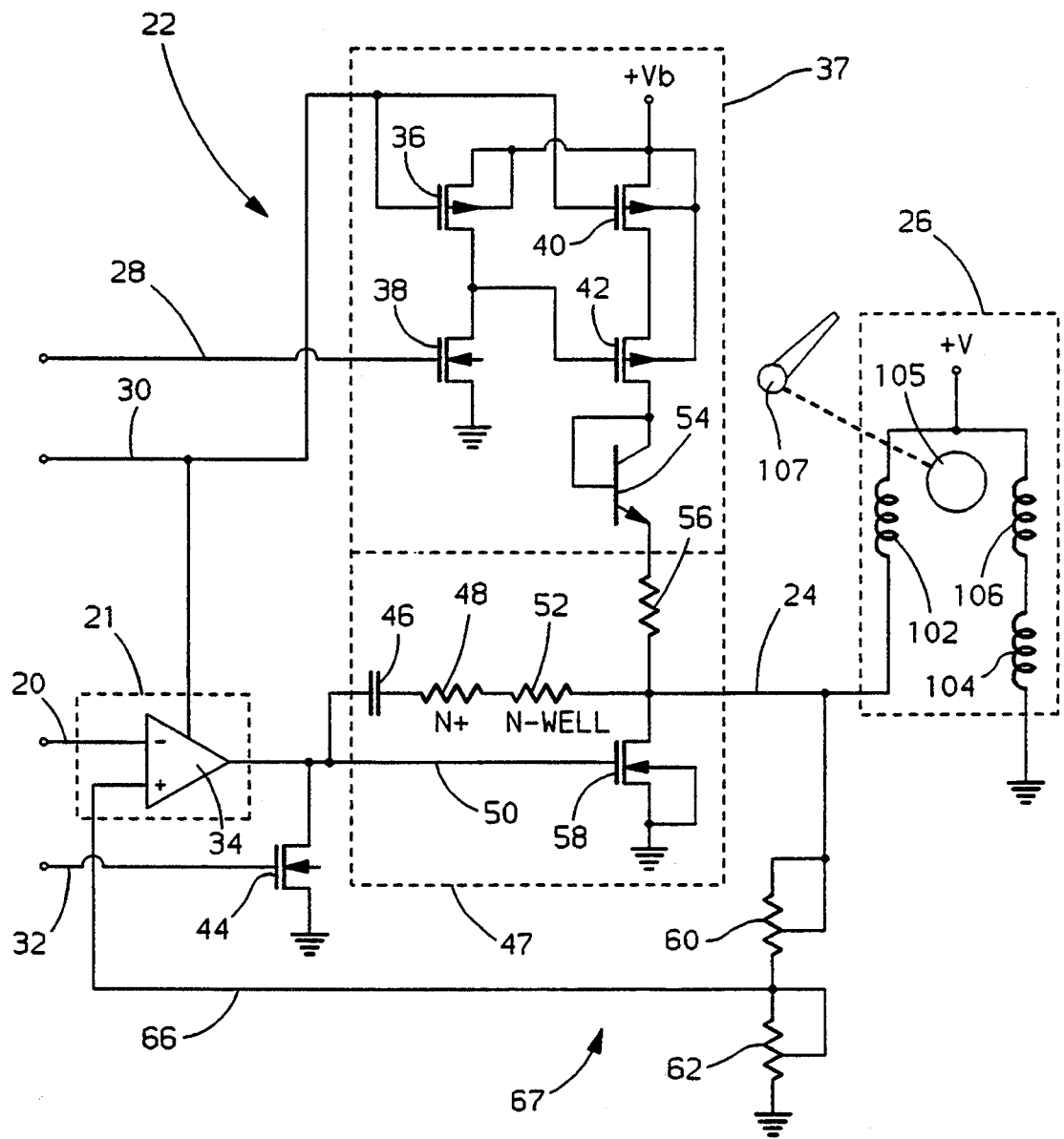
FIG. 2 illustrates the circuit apparatus of this invention.

Referring to FIG. 2, air core gauge driver 22 is shown in detail utilizing CMOS technology to drive air core gauge 26 responsive to the command on line 20. In the circuit shown, the output signal on line 24 is directly connected to air core gauge 26 to directly drive air core gauge 26 without requiring any external drive transistors.

In the implementation shown, air core gauge 26 is a three coil air core gauge comprising coils 102, 104 and 106. Coils 104 and 106 are biased by the supply voltage and coil 102 is driven by the signal on line 24. As the voltage across coil 102 changes, the rotational position of the gauge's rotor 105 changes, causing movement of the gauge pointer 107.

In general, the circuit 22 shown comprises first-stage amplifier 21 receiving the input signal on line 20 and the feedback signal from feedback loop 67 on line 66. First stage amplifier 21 provides an output signal on line 50 responsive to the differential input signals on lines 20 and 66. The output signal on line 50 is the input signal for the second stage amplifier 47. The second stage amplifier 47 provides linear amplification of the output signal using high voltage integrated CMOS technology to provide the gauge drive signal on line 24 used to drive air core gauge 26.

Current for the gauge drive signal on line 24 is provided by current source 37, which is described in more detail below. In general, bias current for the differential amplifier 21 and the current source 37 is provided on line 30 from the bias reference 92 shown in FIG. 4.

More specifically, the signal on line 20 is provided to the inverting input of differential amplifier 34 and is generally in the range between 0–5 volts. Similarly, the feedback signal on line 66, which is a division of the signal on line 24, is also in the range of 0–5 volts. To achieve this voltage range for the feedback connection, the resistor divider comprising resistors 60 and 62 provides a step-down of the signal on line 24. Preferably, the divider resistors comprise diffused P+ resistors. By providing the resistor divider from diffused P+ resistors, a constant divider ratio over the entire intended voltage range of 0–18.5 volts is maintained. The resistors shown include separate N-WELLS that have the effect of doubling the breakdown voltage of the resistor string. Differential amplifier 34 is shown in more detail in FIG. 3.

Figure 3:
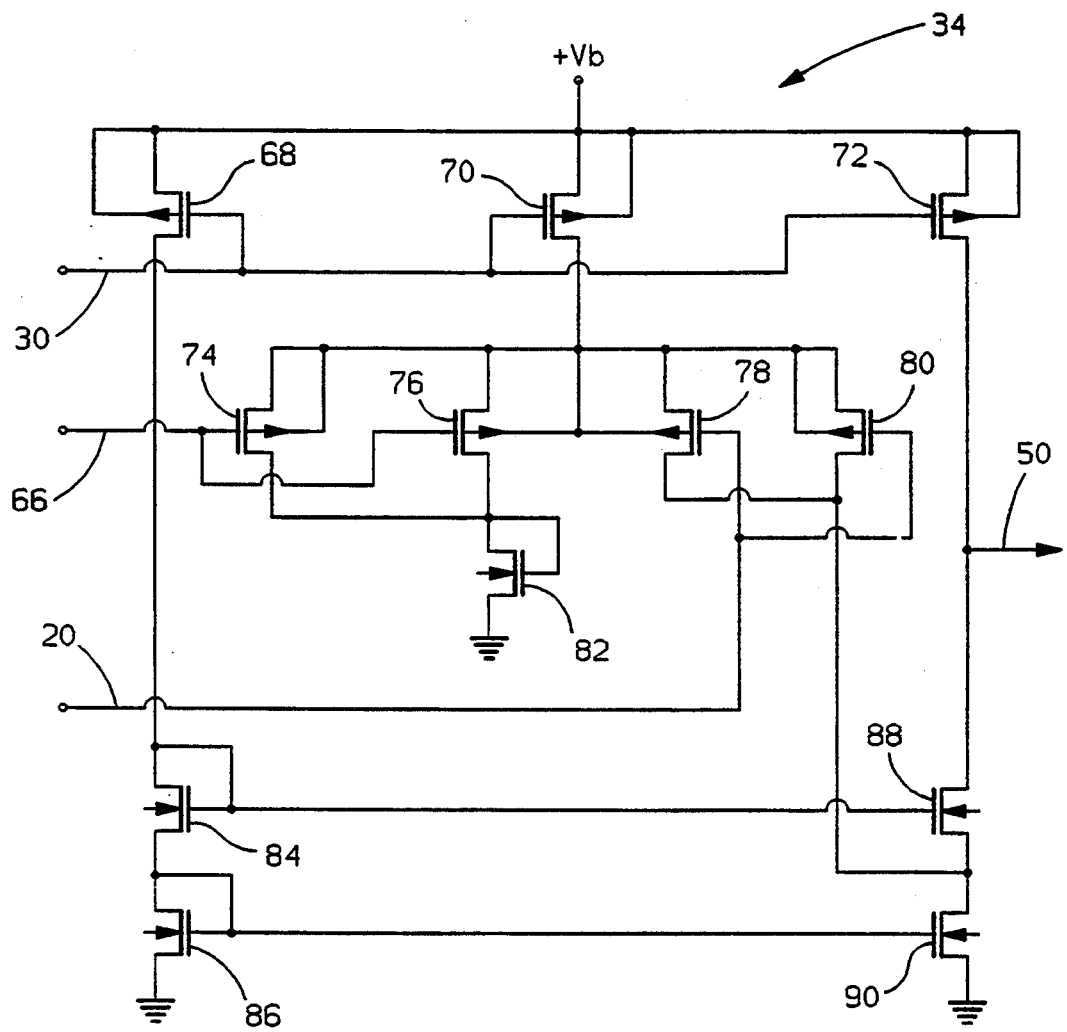
FIG. 3 is an illustration of a circuit for use as the first-stage amplifier of the apparatus of this invention.

Referring now also to FIG. 3, transistors 74, 76, 78 and 80 provide a P-channel differential input stage with a cross-coupled layout receiving current from transistor 70 connected as a current mirror. Current mirror transistors 68, 70 and 72 are biased with a voltage on line 30 provided by bias reference 92 shown in FIG. 4.

The amplifier 34 shown is intended for IC operation in the range of 0–5 volts, but may be used with a wider voltage range limited only by the battery supply voltage +Vb and the breakdown voltage of the transistors. The possible output swing on line 50 is from 0 to the supply voltage. This high output swing allows for the use of a smaller output grounding transistor 58 in second amplifier stage 47.

Transistor 88 is a high voltage N-channel device and prevents circuit damage during high voltage outputs on line 50. Transistors 82, 84, 86 and 90 are also high voltage devices necessary to match the performance of the current mirrors.

The cross-coupled layout of transistors 74, 76, 78 and 80 reduces the voltage offsets. Transistor 82 forces the drain voltage on the positive side of the differential stage to be close to that on the opposite side of the differential stage, thereby reducing voltage offsets.

The voltage gain, A, of first-stage amplifier 34 can be shown to be substantially:

$$A = g_{m78+80} r_{o72},$$

or substantially $A = g_m r_o'$. Preferably, transistor 72 has a long channel length on the order of 24 um and the transistors 88 and 90 have channel lengths on the order of 7 um, each. The result is $r_o'$ very large compared to a typical $r_o$. With the channel lengths given, the gain improvement over a typical single stage amplifier having a gain $A = g_m r_o$ is on the order of a factor of ten. Even if all of the transistors have equal channel lengths, the gain improvement of the amplifier shown over a typical single stage amplifier without a cascode circuit is on the order of a factor of three. Another advantage of the high gain circuit shown is that the folded cascode stage has a rail-to-rail swing and a large common mode range.

Advantageously, the upper rail according to this invention can be set higher than the regulated supply voltage. For example, in a typical vehicle implementation, the regulated supply voltage is 5 volts and the vehicle battery supply voltage is 13 volts. With the regulated supply voltage powering the integrated circuit, the upper rail can be coupled to the 13 volt vehicle voltage supply line, enabling a 0–13 volt rail-to-rail swing at the output of the first amplifier stage:

If the rail to rail swing were not available as provided by this invention, an additional gain stage would be needed between amplifier 34 and amplifier 47. Advantageously, this invention eliminates the need for three amplification stages. Another advantage provided by this invention is the simplified feedback scheme shown not available in three-stage amplifier schemes.

Transistor 44 (FIG. 2) and line 32 are implemented as a control that can switch off the air core gauge driver. A high signal on line 32 biases transistor 44, grounding line 50 and bringing the output on line 24 high.

In the second amplifier stage 47, transistor 58 is a high voltage transistor, capable of sinking 60 mA of current with a voltage out low of 1 volt at 12 volts battery supply. Transistor 58 is also capable of handling the high voltages that are possible with a gauge directly connected to the battery supply. The gate of transistor 58 is 7,632 microns wide. (Note: When additional current drive is needed, an external PNP transistor connected in an emitter-follower configuration may be used. However, this is not necessary for most gauge applications.) DC feedback from the gauge is coupled through resistors 60 and 62 as described above.

AC feedback from the gauge is provided through resistors 48 and 52 and capacitor 46. Resistor 52 protects the feedback capacitor 46 during high voltage transient. This resistor is a 9 KΩ N-WELL resistor that limits fault currents. Resistor 48 is an N+ resistor in series with capacitor 46 and limits the voltage seen by capacitor 46 by providing diode breakdown between the N+resistor 48 and the P-substrate when a high voltage is forced on line 24. The breakdown voltage of the N+ resistor 48 is 22 volts with the capacitor having a working voltage of 25 volts. In general, the diode break down voltage of N+ resistor 48 is less than the maximum working voltage of capacitor 46. A suitable value for capacitor 46 is 10 pF.

Line 28 selects between open drain and active pull-up operation of the circuit. When line 28 is high, transistor 42 is active and transistors 40, 42 and 54 provide a current to resistor 56 to normally pull line 24 high. When line 28 is low, transistor 42 is disabled and the output on line 24 is an open drain output. For the air core gauge 26 shown, line 28 may be maintained high or low.

Figure 4:
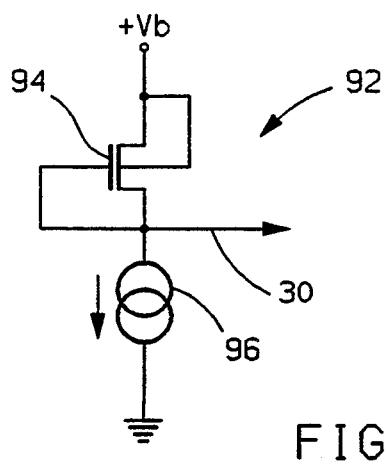
FIG. 4 illustrates a bias reference circuit for use with this invention.

Referring to FIG. 4, the bias voltage on line 30 is provided by transistor 94 and current source 96. Current source 96 forward biases transistor 94, which provides a steady bias voltage at line 30 proportional to the current through transistor 94.

The above described implementation of this invention is an example implementation. Various improvements and modifications to this invention may occur to those skilled in the art and such improvements and modifications will fall within the scope of this invention as set forth below.

The embodiments of the invention in which an exclusive property or privilege is claimed are defined as follows:

1. An apparatus comprising:
   means for providing a measurement signal indicative of a measure of a parameter;

an air core gauge for indicating the measurement of the parameter; and an integrated circuit receiving the measurement signal and responsively providing a drive signal to the air core gauge, the integrated circuit comprising:

a first amplifier stage comprising a differential amplifier with first and second inputs and including a cross-coupled layout having a gain of substantially $g_m r_o'$, where $g_m$ and $r_o'$ represent the first amplifier stage transconductance and output impedance, respectively, the first input receiving the measurement signal and the second input receiving a feedback signal, wherein the first amplifier stage provides an output signal responsive to the measurement signal and the feedback signal; and a second amplifier stage receiving the output signal, the second amplifier stage comprising a high voltage transistor with a drain and a gate, a feedback loop coupled between the drain and gate, the feedback loop comprising, in series, a capacitor, an N+ resistor and an N-WELL resistor, the second amplifier stage providing the drive signal to the air core gauge, wherein the air core gauge is driven responsive to the measure of the parameter and the feedback signal is proportional to the drive signal.

2. The apparatus of claim 1, wherein the N+ resistor has a diode break-down voltage less than a maximum working voltage of the capacitor.

3. The apparatus of claim 1 wherein the first amplifier stage provides the output signal with a rail-to-rail swing.

4. The apparatus set forth in claim 3, wherein the integrated circuit is coupled to a regulated voltage supply providing a first voltage and wherein the first amplifier stage has an upper rail coupled to a voltage supply providing a second voltage higher than the first voltage and wherein the rail-to-rail swing of the output signal has a range from zero to the second voltage level.

5. An apparatus comprising an integrated circuit including a first stage amplifier and a second stage amplifier, the first stage amplifier characterized by a cross-coupled integrated circuit layout providing a linear gain, A, substantially defined as $A = g_m r_o'$, where $g_m$ and $r_o'$ represent the first amplifier stage transconductance and output impedance, respectively, the second stage amplifier coupled to a first output of the first stage amplifier and comprising a high-voltage integrated circuit transistor with an AC feedback circuit comprising, in series, a capacitor, an N+ resistor and an N-Well resistor, wherein the second stage amplifier has a second output used to directly drive an inductive load.

6. The apparatus of claim 5, wherein the N+ resistor has a diode break-down voltage less than a maximum working voltage of the capacitor.

7. An integrated circuit gauge driver coupled between rails of a voltage supply for receiving a measurement signal indicative of a parameter being measured and providing a drive signal to drive an air core gauge to indicate the measured parameter, the integrated circuit gauge driver comprising:

a first stage differential amplifier having first and second inputs, the first input receiving the measurement signal and the second input receiving a feedback signal, the first stage differential amplifier providing an output signal representing an amplified difference between the measurement signal and the feedback signal and a maximum output signal swing from rail-to-rail of the voltage supply;

a second amplifier stage having a second stage input for receiving the output signal and a second stage output for providing the drive signal to drive the air core gauge, the second amplifier stage including a feedback loop coupled between the second stage input and second stage output, the feedback loop comprising, in series, a capacitor, an N+ resistor and an N-WELL resistor, with the feedback signal received by the second input of the first stage amplifier being proportional to the drive signal provided by the second stage output.

8. The integrated circuit gauge driver of claim 7, wherein the N+ resistor has a diode break-down voltage less than a maximum working voltage of the capacitor.

* * * * *